(12) United States Patent
Fertig et al.

(10) Patent No.: US 10,218,368 B2
(45) Date of Patent: Feb. 26, 2019

(54) SYSTEM AND METHOD FOR IN-SITU OPTIMIZATION OF MICROWAVE FIELD HOMOGENEITY IN AN ATOMIC CLOCK

(71) Applicant: Honeywell International Inc., Morris Plains, NJ (US)

(72) Inventors: Chad Fertig, Bloomington, MN (US); Kenneth Salit, Plymouth, MN (US)

(73) Assignee: Honeywell International Inc., Morris Plains, NJ (US)

( * ) Notice: Subject to any disclaimer, the term of this patent is extended or adjusted under 35 U.S.C. 154(b) by 226 days.

(21) Appl. No.: 15/186,152

(22) Filed: Jun. 17, 2016

(65) Prior Publication Data

US 2017/0244418 A1   Aug. 24, 2017

Related U.S. Application Data

(60) Provisional application No. 62/296,900, filed on Feb. 18, 2016.

(51) Int. Cl.
*H03L 7/26* (2006.01)
*H03L 5/02* (2006.01)
*G04F 5/14* (2006.01)

(52) U.S. Cl.
CPC ............... *H03L 7/26* (2013.01); *G04F 5/145* (2013.01); *H03L 5/02* (2013.01)

(58) Field of Classification Search
CPC .................................. H03L 7/26; G04F 5/145
See application file for complete search history.

(56) References Cited

U.S. PATENT DOCUMENTS

| 3,054,069 A | 9/1962 | Kastler et al. |
| 4,331,933 A | 5/1982 | Allan et al. |
| (Continued) | | |

FOREIGN PATENT DOCUMENTS

| CN | 1603984 | 4/2005 |
| CN | 1658095 | 8/2005 |
| (Continued) | | |

OTHER PUBLICATIONS

State Intellectual Property Office of People's Republic of China, "First Office Action for CN Application No. 201410214924.1", "Foreign Counterpart to U.S. Appl. No. 14/084,819", dated Aug. 1, 2017, pp. 1-17, Published in: CN.

(Continued)

*Primary Examiner* — Jeffrey Shin
(74) *Attorney, Agent, or Firm* — Fogg & Powers LLC (57) ABSTRACT

A method of operating a cold atom clock to maintain a highly homogeneous microwave field is provided. The method includes: driving a subset of microwave feed lines to excite a microwave field in a resonator, while a power and a phase of at least one microwave feed line in the subset is held constant, and while the power or the phase of at least one other microwave feed line in the subset is changed; measuring a strength of the atomic transition excited by the microwave field; extracting a relative power and a relative phase between or among the subset of microwave feed lines by processing the strength of the atomic transitions excited by the microwave field measured in at least one auxiliary-measurement sequence; and determining if an adjustment to one or more of the microwave feed lines is needed to improve the homogeneity of the microwave field phase and amplitude.

20 Claims, 6 Drawing Sheets

(56) References Cited

U.S. PATENT DOCUMENTS

| | | | |
|---|---|---|---|
| 4,812,763 | A | 3/1989 | Schmalbein |
| 5,852,386 | A | 12/1998 | Chantry et al. |
| 6,215,366 | B1 | 4/2001 | Kern et al. |
| 6,225,870 | B1 | 5/2001 | Mei et al. |
| 6,303,928 | B1 | 10/2001 | Buell et al. |
| 7,030,704 | B2 | 4/2006 | White |
| 7,944,317 | B2 | 5/2011 | Strabley et al. |
| 8,237,105 | B1 | 8/2012 | Bulatowicz et al. |
| 9,083,363 | B2 | 7/2015 | Fertig et al. |
| 2005/0088248 | A1 | 4/2005 | White |
| 2006/0051213 | A1 | 3/2006 | Touchberry et al. |
| 2010/0033255 | A1 | 2/2010 | Strabley et al. |
| 2010/0033256 | A1 | 2/2010 | Strabley et al. |
| 2010/0111750 | A1 | 5/2010 | Touchberry et al. |
| 2012/0154062 | A1* | 6/2012 | Wilkinson ............... G04F 5/14 331/94.1 |
| 2013/0265112 | A1* | 10/2013 | Strabley ................... H03L 7/26 331/94.1 |
| 2017/0016968 | A1* | 1/2017 | Salit ....................... G01R 33/26 |

FOREIGN PATENT DOCUMENTS

| | | |
|---|---|---|
| CN | 101592843 | 12/2009 |
| JP | 2009302706 | 12/2009 |
| WO | 9712298 | 4/1997 |

OTHER PUBLICATIONS

European Patent Office, "Extended European Search Report for EP Application No. 16201287.6", "Foreign Counterpart to U.S. Appl. No. 15/186,152", dated Jun. 9, 2017, pp. 1-6, Published in: EP.

Xucheng Wang et al., "Integrating Sphere Cold Atom Clock with Cylindrical Microwave Cavity", "Frequency Control and the European Frequency and Time Forum (FCS), 2011 Joint Conference of the IEEE International", May 2, 2011, pp. 1-3, Publisher: IEEE.

European Patent Office, "Extended European Search Report from EP Application No. 14167008.3 dated Feb. 1, 2016", "from Foreign Counterpart of U.S. Appl. No. 14/084,819", dated Feb. 1, 2016, pp. 1-7, Published in: EP.

U.S. Patent and Trademark Office, "Notice of Allowance", "from U.S. Appl. No. 14/084,819", dated Apr. 14, 2015, pp. 1-5, Published in: US.

U.S. Patent and Trademark Office, "Office Action", "from U.S. Appl. No. 14/084,819", dated Dec. 5, 2014, pp. 1-15, Published in: US.

Stefanucci et al., "Compact microwave cavity for high performance rubidium frequency standards", "Review of Scientific Instruments", 2012, vol. 83, Publisher: American Institute of Physics.

Violetti et al., "New Miniaturized Microwave Cavity for Rubidium Atomic Clocks", 2012, pp. 315-318, Publisher: IEEE, Published in: CH.

Xia et al., "Characteristics of a Novel Kind of Miniaturized Cavity-Cell Assembly for Rubidium Frequency Standards", "IEEE Transations on Instrumentation and Measurement", Jun. 2006, pp. 1000-1005, vol. 55, No. 3, Publisher: IEEE.

* cited by examiner

SYSTEM AND METHOD FOR IN-SITU OPTIMIZATION OF MICROWAVE FIELD HOMOGENEITY IN AN ATOMIC CLOCK

This application claims the benefit of U.S. Provisional Application No. 62/296,900 filed on Feb. 18, 2016, which is incorporated herein by reference in its entirety.

This invention was made with Government support under Government Contract Number W31P4Q-09-C-0348 and agency U.S. Army AMCOM. The Government has certain rights in the invention.

BACKGROUND

Atomic frequency standards (atomic clocks) are some of the most stable frequency references available. Due to this stability, atomic clocks are frequently used in multiple applications that demand stable frequency references. Miniature cold atom clocks may employ miniature microwave resonators, which may be driven by microwave feed lines, to produce highly homogeneous microwave fields. Miniature cold atom clocks are small in size, require low power consumption, and are capable of high accuracy. However, such a cold atom clock must maintain accuracy over large temperature swings, which may have deleterious consequences on the microwave electronics that control the clock. For example, temperature excursions can change the dimensions of critical mechanical structures in the device, such as the length of coaxial cables carrying the microwave signals, or can cause timing instability. Thus, temperature changes can reduce the accuracy of the cold atom clock.

SUMMARY

The present application relates to method of operating a cold atom clock to maintain a highly homogeneous microwave field. The method includes: driving a subset of microwave feed lines to excite a microwave field in a resonator, while a power and a phase of at least one microwave feed line in the subset is held constant, and while the power or the phase of at least one other microwave feed line in the subset is changed; measuring a strength of the atomic transition excited by the microwave field in the resonator while driving the subset of the microwave feed lines; extracting a relative power and a relative phase between or among the subset of microwave feed lines by processing the strength of the atomic transitions excited by the microwave field measured in at least one auxiliary-measurement sequence; and determining if an adjustment to one or more of the microwave feed lines in the subset of microwave feed lines is needed to improve the homogeneity of the microwave field phase and amplitude based on the extracting.

DRAWINGS

Understanding that the drawings depict only exemplary embodiments and are not therefore to be considered limiting in scope, the exemplary embodiments will be described with additional specificity and detail through the use of the accompanying drawings, in which:

FIG. 2Bi shows an embodiment of a loop gap resonator inductively fed by eight feed lines in accordance with the present invention;

2Bii shows an exploded view of the loop gap resonator of FIG. 2Bi;

In accordance with common practice, the various described features are not drawn to scale but are drawn to emphasize specific features relevant to the exemplary embodiments.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made. Furthermore, the method presented in the drawing figures and the specification is not to be construed as limiting the order in which the individual steps may be performed. The following detailed description is, therefore, not to be taken in a limiting sense.

Cold atom clocks may employ a quartz crystal oscillator ("Local Oscillator" or "LO") which continuously outputs a signal, and whose frequency is periodically adjusted to compensate for drift or inaccuracy. The periodic adjustment of the frequency of the LO is based on a comparison of the frequency of the LO output to the energy splitting between internal states of atoms trapped in a cold atomic cloud that is trapped inside an ultra-high-vacuum (UHV) cell. The energy splitting between internal states of atoms trapped in a cold atomic cloud is determined by time domain Ramsey spectroscopy, in which the atomic transition is excited by microwaves synthesized from the LO. For example, spectroscopic measurements of the trapped atoms can be used as a reference frequency in a timing system of which the LO is a component. The embodiments of systems and methods described herein generally apply to cold atom sensors.

A cold atom clock may employ miniature microwave resonators, which may be driven by microwave feed lines to generate a microwave field in the volume occupied by the cold atom cloud. In one embodiment, the microwave resonator is a loop gap resonator. Cold atom clocks are small in size and capable of high accuracy, due to the highly homogeneous microwave field used to interrogate the cold atom cloud. The microwave energy is brought from a microwave source to the microwave resonator via a plurality of transmission line cables (referred to herein as microwave feed lines or feed lines) originating at a microwave source and terminating at the resonator. The cables are used to excite the resonator via capacitive or inductive coupling structures.

To achieve the high resonator (microwave) field homogeneity required for optimal performance of an atomic clock (e.g., a cold atom clock), an exact balancing of the phase and power of the microwave energy delivered to the resonator by the cables must be achieved. Under large temperature excursions, the electrical and mechanical properties of the drive circuit, coaxial lines, coupling structures, and resonators may change, causing a degradation of the balance in the phase and power, which results in a loss of performance. Specifically, if the phase and power of the microwave feed becomes unbalanced, the microwave field generated by the feeds is no longer homogenous, and the clock loses accuracy through the mechanism of the in-homogenous-phase, which is also called a distributed-phase or a clock frequency shift as known to those skilled in the art.

The methods and systems for maintaining a highly homogeneous microwave field under changing temperature, which are described herein, use auxiliary measurements to calibrate both the phase and the power of the microwave energy delivered to the resonator by the cables (feeds). The auxiliary measurements are distinct from the clock measurements, which lock the clock to the frequency of the atomic transitions. Each auxiliary measurement includes a series of steps, which, in combination, are referred to herein as an auxiliary-measurement sequence. A total calibration of the phase and the power of the microwave energy delivered to the resonator typically includes a plurality of auxiliary-measurement sequences with each sequence activating a subset of the cables in the system. Since each auxiliary-measurement sequence provides information about the balance of phase and power between or among the subset of activated cables, the data obtained during an auxiliary-measurement sequence is referred to herein as a data set in a plurality of data sets in a complete calibration. The data set obtained in each auxiliary-measurement sequence is used to determine if the phase and power balance is unbalanced for the associated subset of cables. If the data in an auxiliary-measurement sequence indicates the phase and power balance is unbalanced, the processor in the system adjusts the phase and power of the cables or outputs. This is different from prior art systems, which determine if the overall microwave power level has shifted, but do not determine and correct (optimize) the phase homogeneity of the microwave field exciting the atoms.

As defined herein, an atomic measurement cycle is the creation, excitation, and destruction of one atom cloud. It provides the smallest "particle" of data. As defined herein, a clock measurement cycle is a type of atomic measurement cycle in which data is obtained to steer the LO. As defined herein, an auxiliary measurement cycle is a type of atomic measurement cycle in which data is obtained to infer the phase and power balance of feed lines of a current subset of cables. As defined herein, an auxiliary measurement sequence is a set of P auxiliary-measurement cycles, needed to fully characterize one subset of feed lines. The $i^{th}$ cycle has a different setting of phase and or power from the $(i+1)^{th}$ cycle, and these are stepped through in order to build up the entire sequence.

Advantageously, the auxiliary-measurement cycles can be interleaved with clock measurement cycles so the phase and power of the microwave feeds are calibrated without stopping the clock functionality of continuous corrections to the LO. For example, clock measurement cycles are obtained for N atomic cloud measurement cycles. N is a positive integer. At the time when the $(N+1)^{th}$ atomic cloud measurement cycle would have been a clock measurement cycle, q, where q is greater than or equal to 1 ($q \geq 1$), auxiliary measurement sequences are performed instead. Then, for the next N cycles, the atomic cloud measurements again provide clock measurement cycles. Then, after N additional clock measurement cycles, another q auxiliary measurement sequences are performed. In this manner, a complete auxiliary-measurement sequence, which requires m data points (m is a positive integer) is completed every (m*N)/q atomic cloud measurements. If the complete calibration of the relative phase and power of all the feed lines requires the data from P auxiliary-measurement cycles (P is a positive integer), a full calibration of the microwave phase and power is obtained every P×m×N/q atomic cloud measurement cycles. In one embodiment, the atomic cloud measurement cycle may take less than 20 milliseconds. Given the speed of the atomic cloud measurement cycle, this procedure provides a continuously ongoing calibration that does not interfere with the stabilization of the LO. In another implementation of this embodiment, q is more than 1 and is up to P so that up to P auxiliary measurement cycles are performed in a cluster, before returning to clock-measurement cycles.

The methods and systems for maintaining a highly homogeneous microwave field while the temperature of the clock body is changing due to a temperature varying environment are described herein. The methods and systems described herein provide an internal calibration routine for a cold atom clock, which corrects for any phase or power shift of the microwave field exciting the atoms due to temperature shifts or other environmental changes. During this calibration process, subsets of a plurality of the microwave feed lines are sequentially powered, and their phase and power adjusted, under microprocessor control. The powered feed lines cause transitions between the atomic states used in the normal clock measurement cycles; however, in the auxiliary, cycles which form part of the calibration routine described here, the atom-transition information is used to detect imbalances in the phase and power, rather than to provide new information to the LO steering circuitry. The atom-based power and phase balancing signatures are detected during the operation of each subset for the plurality of phase and power of the microwave feed lines. At least one processor executes algorithms to cycle the various subsets of microwave feed lines through the sequential powering of the subsets of microwave feed lines. In one implementation of this embodiment, the subset is a pair of microwave feed lines. In another implementation of this embodiment, the subset is a pair of microwave feed lines that feed opposite sides of the resonator, for example, as related by reflection through a point, axis, or plane of symmetry of the resonator geometry. The at least one processor analyzes the atom-based signatures during the cycling, calculates any required corrections in the phase and power of the microwave feed lines required to ensure the phase and power driving those feed lines is suitable for producing the most homogeneous field in the resonator, and causes corrections to be applied to the signals driving the feed lines.

This technique is far preferable over any prior art electrical measurements (for example, by employing a pick-up antenna), since there is no electrical method of establishing the microwave phase or power at the center of the resonator without disturbing the microwave field there. Furthermore, any electrical probes are themselves subject to inaccuracy due to the fluctuating temperatures of the clock body, whereas the atoms in the vacuum cell do not interact with the clock body, and thus can serve as a reference against which to accurately judge changes in the absolute phase and power of the microwave field established in the resonator.

Figure 1:
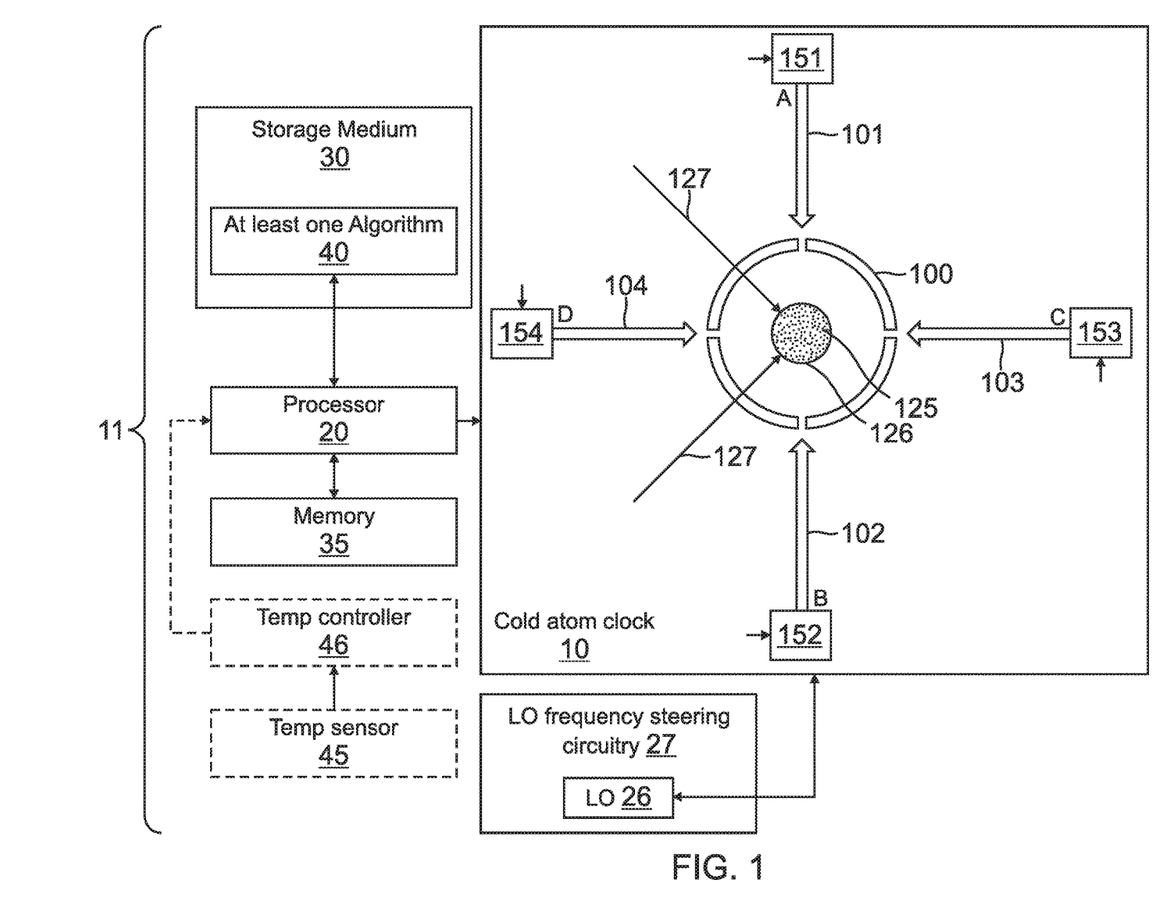
FIG. 1 is schematic drawing of an embodiment of a system to calibrate a cold atom clock in accordance with the present application.

FIG. 1 is a schematic drawing of an embodiment of a system 11 to operate to operate an accurate atomic clock (i.e., the cold atom clock 10) by maintaining a highly homogeneous microwave field 126 in accordance with the present application. The system 11 is configured to maintain a highly homogeneous microwave field 126 by providing an ongoing calibration of the cold atom clock 10 while the cold atom clock 10 provides a stable frequency reference. By performing the ongoing calibration, the cold atom clock maintains accuracy over large temperature swings. The system 11 includes the cold atom clock 10, a local oscillator 26 in a local oscillator steering circuit 27, a memory 35, at least one processor 20, and at least one algorithm 40 in a storage medium 30. The system 11 optionally includes at least one temperature sensor 45 and a temperature controller 46.

In one implementation of this embodiment, the memory 35 is internal to the processor 20. The processor 20 is communicatively coupled to the cold atom clock 10 and the at least one algorithm 40. The processor 20 executes the at least one algorithm 40 to calibrate the cold atom clock 10 as described herein. The local oscillator steering circuit 27 is communicatively coupled to the cold atom clock 10. In one implementation of this embodiment, the at least one temperature sensor 45 is configured to sense a temperature of the cold atom clock 10. The temperature controller 46 is communicatively coupled to input data from the at least one temperature sensor 45. The temperature controller 46 is communicatively coupled to the processor 20 to provide information indicative of a temperature change of the cold atom clock 10 to the processor 20.

The cold atom clock 10 includes a resonator 100, four exemplary microwave feedlines 101, 102, 103, and 104, and four phase-and-amplitude-adjust modules 151, 152, 153, and 154 associated with the respective microwave feedlines 101, 102, 103, and 104. The resonator 100 is driven by the microwave feedlines 101, 102, 103, and 104 to generate a microwave field in the volume occupied by the atomic cloud 125. When an adjustment to phase or amplitude is determined to be needed (as described below) in a microwave feed line, a signal is sent to the phase-and-amplitude-adjust module associated with the microwave feed line, and responsive to the signal, the phase or amplitude is adjusted.

In certain embodiments of the cold atom clock 10, a vacuum cell 126 is mounted within a microwave resonator 100. The vacuum cell 126 admits laser beams 127 that cool/trap atoms at particular locations within the vacuum cell 126. In at least one implementation, faceted windows on the vacuum cell 126 permit the introduction of laser beams into the vacuum cell 126 that fits within the microwave resonator. Further, the microwave resonator 100 encircles the vacuum cell 126 and generates a microwave field in the interior volume of the vacuum cell 126 occupied by the cold atom cloud 125.

In one implementation of this embodiment, the cold atom clock is housed in a physics package to be implemented as a cold atom sensor. In another implementation of this embodiment, the resonator produces a microwave field with uniform, linear polarization along the axis of the resonator and spatially homogenous phase throughout the volume within the resonator and within a vacuum cell 126. In at least one implementation, where the atoms within the vacuum cell 126 are rubidium atoms, the resonator generates a microwave field having a frequency of 6.835 GHz within the vacuum cell 126, where the generated frequency is the resonant frequency of the atoms' ground state hyperfine transition, commonly used as a clock transition in microwave clocks.

The processor 20 is configured to run a plurality of auxiliary-measurement cycles on a respective plurality of subsets of microwave feed lines as part of the calibration process. The at least one algorithm 40 is executed by the processor 10 to converge, during the calibration, on optimal (improved) operation parameters for a phase and a power of the at least two microwave feed lines in the cold atom clock 10.

The cold atom clock 10 is represented generally as a box and can be any one of the various types of cold atom clocks currently available or to be developed. For example, the cold atom clock 10 can be an embodiment the cold atom clocks described in U.S. Pat. No. 9,083,363 issued on Jul. 14, 2015, entitled SYSTEMS AND METHODS FOR A COLD ATOM FREQUENCY STANDARD, which is fully incorporated herein, and which is referred to herein as the '363 Patent. The cold atom clock 10 is communicatively coupled to a processor 20, which executes algorithms 40 in a storage medium 30. In one implementation of this embodiment, the cold atom clock described herein is a miniature, battery-powered microwave primary clock.

The microwave feed lines 101, 102, 103, and 104 are shown as arrows respectively labeled A, B, C, and D. In this document, microwave feed line 101 is referred to as "A" or "A cable", microwave feed line 102 is referred to as "B" or "B cable", microwave feed line 103 is referred to as "C" or "C cable", and microwave feed line 104 is referred to as "D" or "D cable".

The resonator 100 is shown with gaps at the point where the feedline arrows are pointing. In this embodiment, the feed lines 101-104 are capacitively coupled to the loop gap resonator 100, and their conductor and shield are electrically connected to different sides of the gaps to which they point. In one embodiment, a balun transformer is used to couple the feed lines 100-104 to the resonator 100. As shown in FIG. 1, the microwave feed line 101 opposes microwave feed line 102 and is orthogonal to the microwave feed lines 103 and 104. Thus, the microwave feed lines 103 and 104 also oppose each other.

Figure 2:
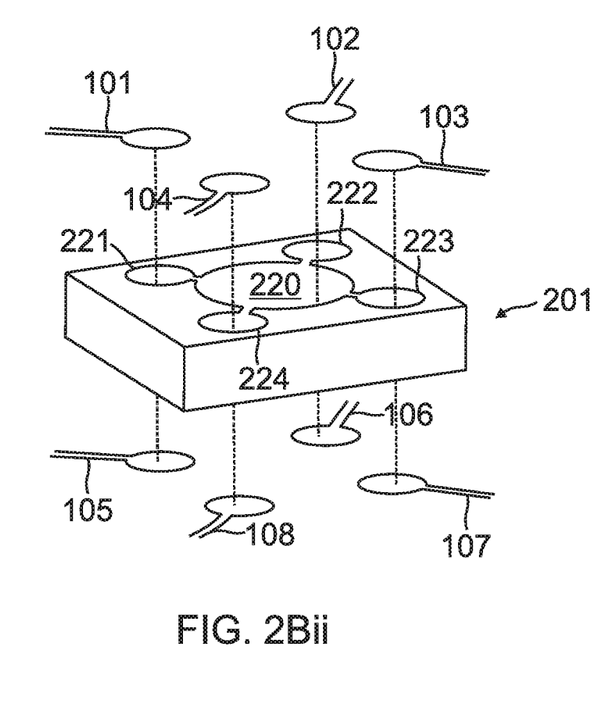
Figure 2A:
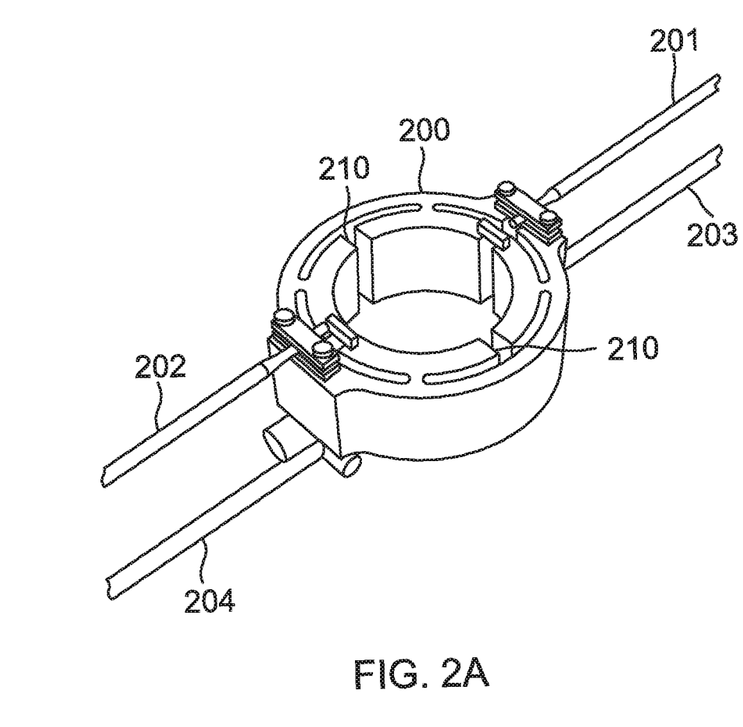
FIG. 2A shows an exemplary resonator to provide a microwave signal and four microwave feed lines in accordance with the present application.

The FIG. 2A shows an embodiment of resonator 200 to provide a microwave signal and four microwave feedlines 201, 202, 203, and 204 in accordance with the present application. The resonator 200 has feed lines at two different locations along the axial direction, which may be referred to as the "top" level and the "bottom" level. As shown in FIG. 1, the microwave feed line 201 opposes microwave feed line 202 and they both feed the top level of the resonator 200. The microwave feed line 203 opposes microwave feed line 204 and they both feed the bottom level of the resonator 200. The microwave feed line 201 is above the microwave feed line 203. The microwave feed line 202 is above the microwave feed line 204. The resonator 200 is a loop gap resonator 200 and includes a metallic slotted loop inside a cylindrical shield, where the loop is formed by electrodes that are separated along the loop by gaps, and where the loop is supported by supports that connect the electrodes to shield, as described in the '363 Patent. The shapes of the resonator 200 determine the frequency of the microwave fields that resonate. For example, the size of the gaps, the length of the supports, the circumference of the shield, and the size of the electrodes determine the frequency of resonant microwave fields.

FIG. 2Bi shows an embodiment of a loop gap resonator 201 inductively fed by eight feed lines 101, 102, 103, 104, 105, 106, 107, and 108 in accordance with the present invention. FIG. 2Bii shows an exploded view of the loop gap resonator 201 of FIG. 2Bi. In FIG. 2Bii, the feedlines 101 and 105 are shown offset from the associated circular region 221; the feedlines 102 and 106 are shown offset from the associated circular region 222; the feedlines 103 and 107 are shown offset from the associated circular region 223; and the feedlines 104 and 108 are shown offset from the associated circular region 224. The feed lines 101, 102, 103, 104, 105, 106, 107, and 108 terminate in loops above and below the associated circular regions 221, 222, 223, and 224, and create a microwave field in the central region 220 when energized by a driving field with the correct phase and amplitudes on each drive line.

Figure 3:
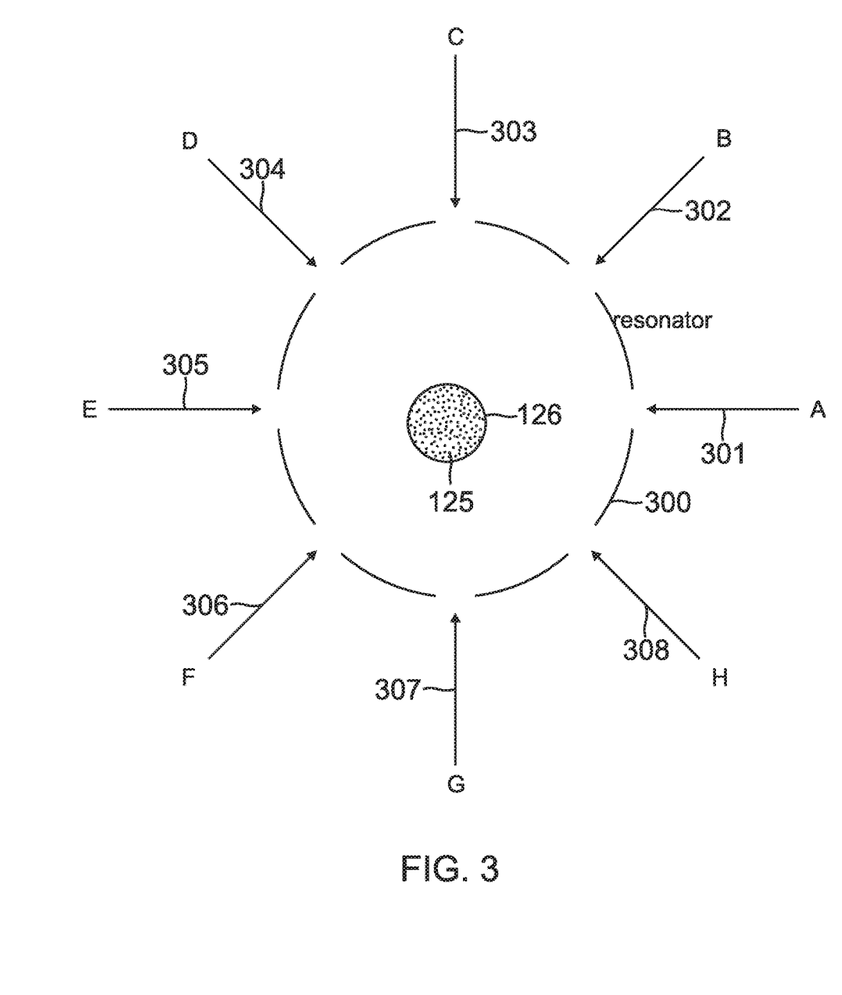
FIG. 3 is a schematic drawing of an embodiment of eight coaxial microwave feedlines and a resonator to generate an atomic cloud in accordance with the present application.

FIG. 3 is schematic drawing of an embodiment of eight coaxial microwave feedlines 301-308 and a resonator 300 to generate an atomic cloud 125 in accordance with the present application. The microwave feed lines 301-308 are shown as arrows respectively labeled A-H. The resonator 300 is a loop gap resonator 300 and is shown with gaps at the point where the feedline arrows 101-108 are coupled, in a capacitively coupled embodiment. As shown in FIG. 3, the eight microwave feed lines 301-308 are all at angles of multiple integrals of 45 degrees (i.e., L*45°, where L is a positive integer) with reference to the other. The microwave feed line 301 opposes microwave feed line 305 and is orthogonal to the microwave feed lines 303 and 307. The microwave feed line 302 opposes microwave feed line 306 and is orthogonal to the microwave feed lines 304 and 308. In another implementation of this embodiment, a resonator is fed with three microwave feed lines, and the angles between the three microwave feed lines are integral multiples of 120 degrees. Notably, while it is conventional for the feed lines to be symmetrically arranged around the resonator, is not necessary that that this be so for the operation of the calibration method described herein.

FIGS. 1, 2A, 2Bi, and 3 show various resonator and microwave feed line configurations. Other resonator and microwave feed line configurations can be used implement the techniques described herein. A requirement for the techniques described herein is that at least two feedlines generate at least two respective microwave fields, in which at least a portion of the at least two respective microwave fields include counter-propagating components. The algorithms 40 described herein converge on the optimal operation parameters for phase and power of the microwave feed lines. However, the final quality of the homogeneity of the microwave field produced in the resonator may be better or worse depending on the particular geometry used for the microwave feed lines.

Figure 4:
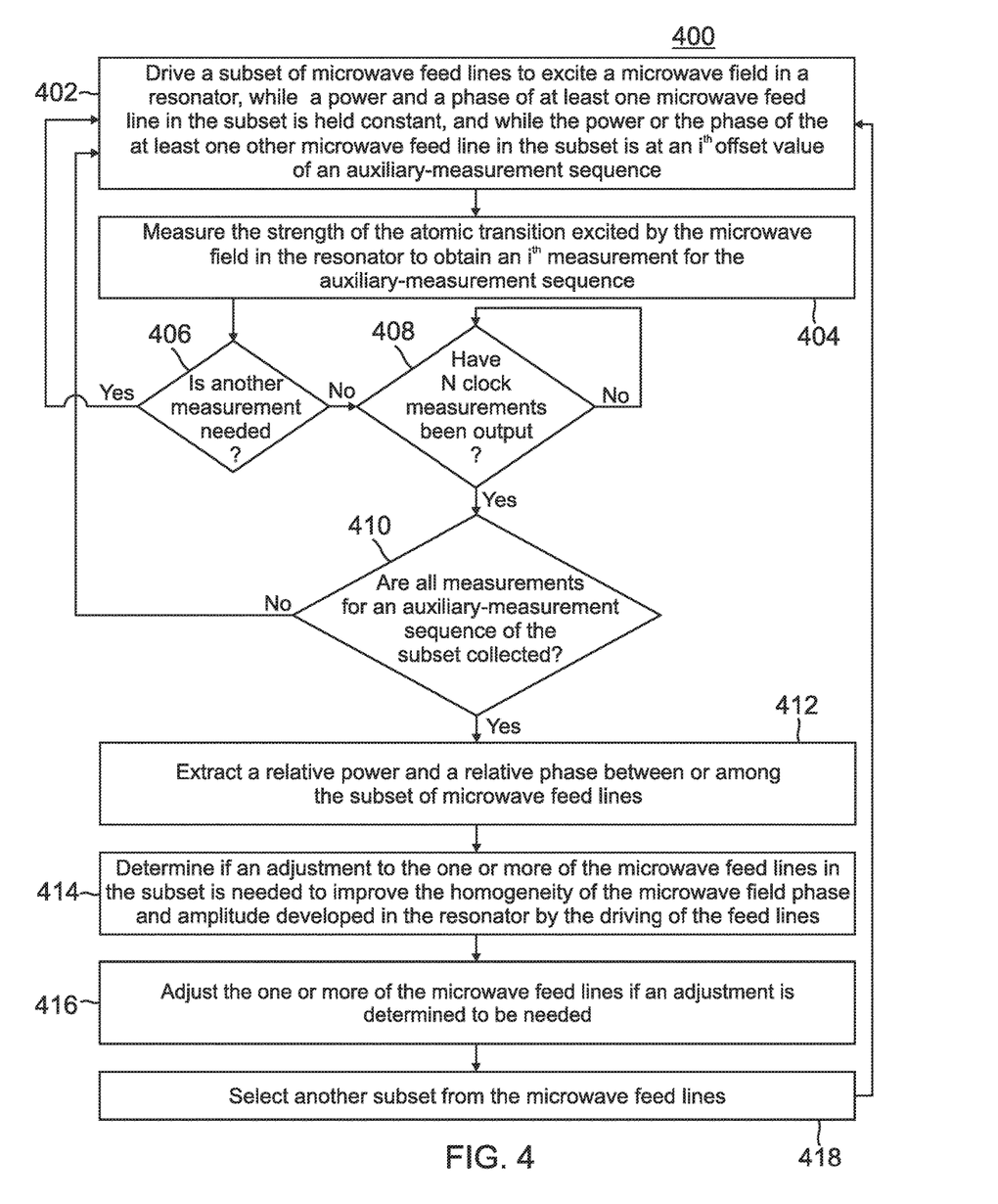
FIG. 4 is a flow diagram of an embodiment of a method of maintaining a highly homogeneous microwave field in a cold atom clock in a calibration of power and phase of the microwave feed lines in accordance with the present application.

FIG. 4 is a flow diagram of an embodiment of a method of maintaining a highly homogeneous microwave field in a cold atom clock in a calibration of power and phase of the microwave feed lines in accordance with the present application. The method 400 is described with reference to FIGS. 1 and 3, but the method is applicable to other embodiments of cold atom clock systems. The calibration is continuously ongoing while the cold atom clock 10 is functional as a stable frequency reference.

During the calibration process, the processor 20 runs at least two auxiliary-measurement cycles on at least two respective subsets of microwave feed lines. The subsets of microwave feed lines (also referred to herein as "subsets") are each driven in a hierarchical or round robin comparison network. In one implementation of this embodiment, the memory 35 stores the flow of the hierarchical or the round robin comparison network for the subset. For example, the memory 35 can store a listing of the subset of microwave feed lines (e.g., a first subset of cables A and B and a second subset of cables C and D) and a sequence for driving each of the subsets (e.g. first cable A, then cable B for the subset of cables A and B). In this case, when the auxiliary-measurement cycle for a given subset is completed, the processor 20 retrieves the next subset (e.g. the subset that includes cables C and D) from the memory 35, which is then driven in the hierarchical or round robin comparison network for that subset (e.g. first cable C, then cable D for the subset of cables C and D).

An auxiliary-measurement cycle that is run in one of a hierarchical or a round robin comparison network is described as outlined in the processes of blocks 402-410.

At block 402, a subset of microwave feed lines is driven to excite a microwave field in a resonator, while a power and a phase of at least one microwave feed line in the subset is held constant, and while the power or the phase of at least one other microwave feed line in the subset is changed.

At block 404, a strength of the atomic transition excited by the microwave field in the resonator while driving the subset of the microwave feed lines is measured. During the $i^{th}$ measurement for the auxiliary-measurement cycle, the strength of the atomic transition excited by the microwave field in the resonator is measured while the power or the phase of at least one other microwave feed line is set at the $i^{th}$ offset value of an auxiliary-measurement cycle. An $i^{th}$ offset value of an auxiliary-measurement cycle is the difference between: 1) the power and/or the phase of the at least one other microwave feed line in the subset, which is being changed during an $i^{th}$ measurement of the auxiliary-measurement cycle, and 2) the power or the phase of the at least one other microwave feed line when the cold atom clock is being run to obtain clock measurements.

For a given auxiliary-measurement cycle, several measurements are taken while the power or the phase of at least one other microwave feed line in the subset is stepped through a plurality of offset values. Specifically, when a first measurement of the auxiliary-measurement cycle is taken, the power or the phase of at least one other microwave feed line is set at a first offset value of an auxiliary-measurement cycle, then when a second measurement of the auxiliary-measurement cycle is taken, the power or the phase of at least one other microwave feed line is set at a second offset value of an auxiliary-measurement cycle, as so forth until all the data points for a auxiliary-measurement cycle are collected.

If the exemplary subset for a given auxiliary-measurement cycle includes the A and B cables (FIG. 1), a microwave field is excited in the resonator 100 by applying a signal to the A and B cables, which couple to opposite sides of the resonator 100, as shown in FIG. 1. The power and/or phase of the microwaves supplied by B (relative to A, which is held constant) is changed (stepped) each time a measurement for the auxiliary-measurement cycle is taken for that subset. The phase of the microwaves supplied by a given cable (or cables) is stepped over 360 degrees and the power of the microwaves supplied by the given cable (or cables) is stepped over a desired power range. The phase steps, power steps, and power range are stored in the memory 35. Then, the power and/or phase of the microwaves supplied by A (relative to B, which is held constant) is changed (stepped). In this manner, cables A and B are a subset that is subjected to an auxiliary measurement cycle in a hierarchical or a round robin comparison network. In another exemplary subset, the subset composed of A and B ("AB") may be driven, with their relative power and phase fixed, and the subset composed of C and D ("CD") may be driven, with their relative power and phase fixed, wherein the relative power and/or phase of "AB" relative to "CD" may be changed (stepped). Similarly, subsets of A and C, and B and D, may be formed, and similarly used, so that any or all combinations of the plurality of feed lines may be driven in a hierarchical, or round robin network. The whole set A, B, C, and D may also be considered a subset of itself.

For yet another example, the subset for a given auxiliary-measurement cycle includes the C, G, B, and F cables (FIG. 3) and a microwave field is excited in the resonator 100 by applying a signal to the C, G, B, and F cables.

The C and G cables, couple to opposite sides of the resonator 100 and cables B and F couple opposite sides of the resonator 100, as shown in FIG. 3. For the exemplary subset of C, G, B, and F cables, the power and phase of the microwaves supplied by C (relative to G, B, and F, which are held constant) is changed (stepped) each time a measurement for the auxiliary-measurement cycle is taken for that subset. Then, in another auxiliary measurement cycle, the power and/or phase of the microwaves supplied by G (relative to C, B, and F, which are held constant) are changed (stepped) each time a measurement for the auxiliary-measurement cycle is taken for that subset. Next the power and phase of the microwaves supplied by B (relative to F, C, and G, which are held constant) are changed (stepped) in each time a measurement is taken for that subset in an auxiliary measurement cycle. Then the power and phase of the microwaves supplied by F (relative to B, C, and G, which are held constant) are changed (stepped) in each time a measurement is taken for that subset in an auxiliary measurement cycle. In this manner, C, G, B, and F cables are driven in the hierarchical or the round robin comparison network in an auxiliary-measurement cycle for that subset of C, G, B, and F cables. Other hierarchical or the round robin comparison networks are possible for the C, G, B, and F cables as is understood by one skilled in the art.

For the exemplary case of the subset of C, G, B, and F cables, the strength of atomic transitions driven by the microwave field in the resonator is measured for subsets of the C, G, B and F feed lines, as the power and/or phase of at least one microwave feed line is changed from the power and/or phase used when the cold atom clock 10 operates clock-cycle phase.

After the measurement of block 404 is taken, the flow proceeds to block 406. At block 406, it is determined if another measurement is needed prior to returning the cold atom clock 10 to clock measurement cycles. In one implementation of this embodiment, the processor 20 is configured to collect two or more $i^{th}$ measurements between N clock cycles. In this case, the flow proceeds from block 406 to block 402 and an $(i+1)^{th}$ measurement is taken for an $(i+1)^{th}$ offset value. In one embodiment, all the auxiliary-measurement cycles for an auxiliary-measurement sequence for a given subset are taken at the same time prior to returning to clock measurement cycles. In another embodiment, all the auxiliary-measurement cycles for all the auxiliary-measurement sequences for all the subsets are taken at the same time prior to returning to clock measurement cycles. In this latter case, a complete calibration of the power and phase of the microwave feed lines are taken at one time. As noted above, a complete calibration of the relative phase and power of all the feed lines requires the data from P auxiliary-measurement sequences. For example, if the temperature sensor 45 indicates an extreme change in temperature of the cold atom clock 10, the processor 20 can initiate a calibration to maintain a highly homogeneous microwave field.

In another implementation of this embodiment, the processor 20 is configured to collect a single auxiliary-measurement cycle between N clock cycles. In that case, the flow proceeds to block 408 from block 406 without returning to block 402.

When the flow proceeds to block 408, the cold atom clock 10 changes to clock measurement cycles from an auxiliary-measurement cycle. During the clock measurement cycles, the phase and power of all the cables are at currently optimized levels to run the cold atom clock 10 and are not at an offset value. At block 408, it is determined if N clock measurements have been output from the cold atom clock 10. If less than N clock measurements have been output from the cold atom clock 10, the flow of method 400 proceeds back to block 408 until N clock measurements have been output. When it is determined that N clock measurements have been output from the cold atom clock 10, the flow of method 400 proceeds from block 408 to block 410. In one implementation of this embodiment the processor 20 counts the number of clock measurement cycles.

At block 410, the processor 20 determines if all auxiliary-measurement cycles for the subset of the microwave feed lines have been collected. If additional data points are need for the ongoing auxiliary-measurement sequence, the flow proceeds back to block 402. A single auxiliary-measurement sequence for a given subset is completed by cycling through blocks 402, 404, 406, 408, and 410 back to 402 until all the data points for a given auxiliary-measurement sequence are collected. If the processor 20 determines all measurements for the auxiliary-measurement sequence for the subset of the microwave feed lines have been collected, the flow proceeds to block 412.

At block 412, a relative power and a relative phase between or among the subset of microwave feed lines is extracted by processing the strength of the atomic transitions excited by the microwave field measured for an auxiliary-measurement sequence.

For the exemplary case of the subset of C, G, B, and F cables, the processor 20 processes the measured strength of the atomic transitions for the auxiliary measurements described with reference to block 404. The processor 20 then executes one or more of the algorithms 40 on the measured strength of the atomic transitions to extract the relative power and relative phase among the subset C, G, B, and F of microwave feed lines A, B, C, D, E, F, G, and H.

At block 414, the processor 20 executes at least one algorithm 40 to determine if an adjustment to the one or more of the microwave feed lines in the subset is needed to improve the homogeneity of the microwave field phase and amplitude developed in the resonator by the driving of the feed lines. For the exemplary case of the subset of C, G, B, and F cables, the processor 20 executes at least one algorithm 40 to determine if an adjustment to the one or more of the microwave feed lines C, G, B, and F in the subset C, G, B, and F of microwave feed lines A, B, C, D, E, F, G, and H is needed to balance one of a phase or a power of microwave energy delivered to the resonator.

At block 416, one or more of the microwave feed lines C, G, B, and F in the subset C, G, B, and F of the plurality of microwave feed lines A, B, C, D, E, F, G, and H to excite a microwave field in the resonator of the cold atom clock is adjusted if an adjustment is determined to be needed at block 408. The processor 20 sends a signal (represented generally at by the arrows pointing at the phase-and-amplitude-adjust modules 151, 152, 153, and 154 in FIG. 1) to one or more of the phase-and-amplitude-adjust modules 151, 152, 153, and 154. Responsive to this signal, the phase-and-amplitudeadjust module 151, 152, 153, and/or 154 adjust the phase and/or power of the respective microwave feed line 101, 102, 103, and/or 104.

When the phase and a power of microwave energy delivered to the clock by the feed lines is balanced, the cold atom clock 10 maintains a highly homogeneous microwave field and the cold atom clock 10 is accurate. In this manner, the at least one algorithm 40 executable by the processor 20 converges on improved (optimal) operation parameters for a phase and a power of the plurality of microwave feed lines.

Thus, at blocks 402 and 404, the microwaves are pulsed on for a short time, the atoms are measured with lasers, and a signal is obtained. By stepping the power and/or phase of the microwaves supplied by one or more subsets of cables (relative to the one or more unchanged cables in the one or more subsets), a new datum for the auxiliary-measurement cycle is added to the data already stored in the memory 35, from which the processor 20 using the algorithm 40 can calculate the relative phase and power between the microwave feed lines 101-104. The processor 20 uses the algorithm 40 to compute any necessary adjustment to the power and/or phase of any of the microwave feed lines 101-104, to optimize the operation of the cold atom clock 10.

At block 418, the processor 20 selects another subset from the plurality of microwave feed lines and the flow proceeds back to block 402 and data for another auxiliary-measurement sequence is collected. Another auxiliary-measurement sequence is run on the subset of the plurality of microwave feed lines selected at block 416. In this manner, a continuous calibration of the power and the phase of the microwave feed lines is interleaved with the clock signals while the algorithm 40 executed by the processor 20, converges on optimal operation parameters for a phase and a power of the a microwave feed lines after looping through auxiliary-measurement sequence for a plurality of subsets of the microwave feed lines.

For example, the next subset of microwave feed lines can be the set of E, A, C, and G cables (FIG. 3). In another implementation of this embodiment, the processor 20 retrieves information indicative of the next subset of microwave feed lines from memory 35.

For the exemplary case of the microwave feed lines A, B, C, D, E, F, G, and H, the processor 20 converges on optimal operation parameters for a phase and a power of the microwave feed lines A, B, C, D, E, F, G, and H after processing a first exemplary subset of C, G, B, and F, a second exemplary subset D, H, E, A, a third exemplary subset D, H, F, and B, a fourth exemplary subset C, G, A, and E. Of course, other subsets can be used and more or fewer subsets can be use.

In this way, the power and phase of the microwaves delivered by each cable can be optimized. This improves the performance of a cold atom clock 10 based on such a microwave resonator 100

Figure 5A:
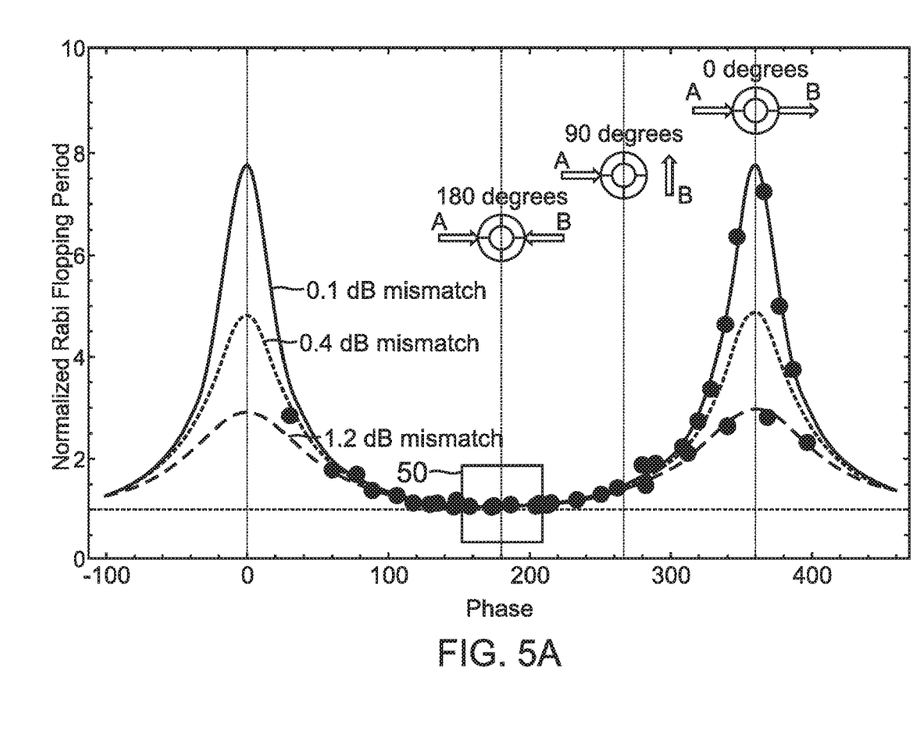
FIG. 5A is a plot of the normalized Rabi flopping period as a function of phase difference between two opposing feed ports.
Figure 5B:
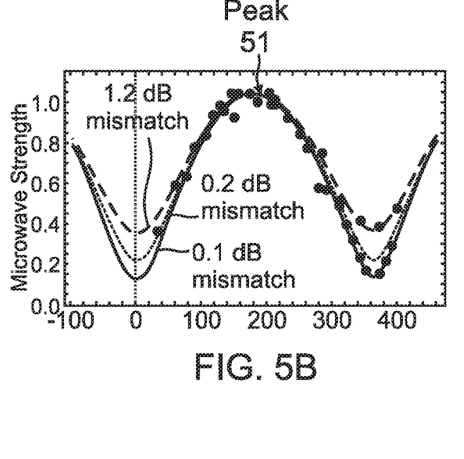
FIG. 5B is a plot of the normalized strength of the microwave field driving the strength versus phase, which is derived from the same data as in FIG. 5A.

The physics of the processes implemented in blocks 402 and 404 is now described for an exemplary auxiliary calibration cycle of the cables in FIG. 1. In the exemplary auxiliary calibration cycle, the microwave feed line 101 is energized while the other microwave feed lines 102-104 are not energized. In the exemplary auxiliary calibration cycle, the duration of the microwave pulse is changed (stepped) to an offset value of the auxiliary-measurement cycle. The excitation strength of the microwave field is reflected in the number of atoms driven in the clock transition, and this measurement is added to the data set by the processor, and held in memory. After one or more auxiliary calibration cycles, a sufficient data set is held in memory for the processor to compute the "Rabi flopping period" of the atoms, as driven by the current subset of energized feed lines with a fixed value of phase and power. FIG. 5A is a plot of the normalized Rabi flopping period as a function of phase difference between two counter propagating feedlines (e.g., the microwave feed lines 101 and 102). Each data point in FIG. 5A is the output of a calculation performed by the processor, in which the Rabi flopping period is extracted by the numerical processing of a set of one or more measurements. The set of one or more measurements form a modulated pattern of population transfer versus pulse duration. The population is the number of atoms driven in the clock transition by the microwave field for the various durations of the microwave pulses applied to the atoms. FIG. 5B is a plot of the normalized strength of the microwave field driving the strength versus phase, which is derived from the same data as in FIG. 5A, in that it is related to the inverse of the normalized Rabi flopping period. The curves are the result of numerical processing by which the relative phase and power of the feed lines are inferred from the data points.

The area enclosed by the block 50 in FIG. 5A is the area of optimal operation conditions in which the balanced phase and power yield fastest Rabi flopping signal and greatest contrast of peak-to-valley for the data points versus phase, for example, comparing the solid line, the short-dashed line, and the large-dashed line. As is known to one skilled in the art, the Rabi flopping period is the rate at which an atomic wave function is caused to make a transition between two energy levels coupled by a driving field that is at, or near, resonance with the energy splitting between the two energy levels. Its measurement communicates the strength of the coupling between the microwave field and the atomic transition. Rabi flopping between the levels of a 2-level system illuminated with a resonant microwave field occurs with a period of the Rabi flopping period. The Rabi frequency is equal to $2\pi$ over the Rabi flopping period.

In the case when the atomic transition is a magnetic dipole transition between two levels, the on-resonance Rabi frequency $b_{i,j}$ is defined as $$b_{i,j} = \frac{\overrightarrow{\mu_{i,j}} \cdot \overrightarrow{B_o}}{\hbar},$$

where $$\overrightarrow{\mu_{i,j}}$$

is the magnetic transition dipole moment for the i→j transition and $\overrightarrow{B_0} = \epsilon \overrightarrow{B_0}$ is the vector magnetic field amplitude which includes the polarization.

To make a coarse balancing of the power for the microwave feed lines 101 and 102, the modulated pattern of population transfer, composed of data from one or more auxiliary measurement cycles, is analyzed by the processor 20 with microwave feed line 101 at a fixed power and phase. Next, the microwave feed line 102 is energized while the other microwave feed lines 101 and 103-104 are not energized, and a new modulated pattern of population transfer, composed of data from one or more auxiliary measurement cycles, is analyzed by the processor 20. Finally, the power to microwave feed line 102 is adjusted to make the Rabi flopping period equal to that produced by microwave feed line 101. This process provides a coarse balancing of the power for the microwave feed lines 101 and 102.

Then both microwave feed lines 101 and microwave feed line 102 are energized while the powers settings for the microwave feed line 101 and microwave feed line 102 from the previous steps are held. Next the phase of microwave feed line 102 is scanned relative to microwave feed line 101. The Rabi flopping period is measured by an an analysis of the modulated pattern of population transfer, composed of data from one or more auxiliary measurement cycles for varying durations of applied microwave pulses delivered simultaneously to microwave feed lines 101 and 102. The processor 20 determines the phase that minimizes the Rabi flopping period. This process provides a coarse adjustment of phase for the microwave feed lines 101 and 102.

Once the coarse adjustments to phase and power balance are completed, a fine adjustment of the phase and power of microwave feed lines 101 and 102 is then completed as follows. A phase of microwave feed line 102, which sits on or near to the peak of the Rabi flopping time versus phase curve, is selected. Notably, this is approximately 180 degrees "wrong" with respect to the phase value which maximizes the homogeneity of the microwave field during normal clock operation. Adjustments to the power of microwave feed line 102 are made until the Rabi flopping time goes to its largest value (i.e., the coupling strength of the microwave field to the atomic transition takes on its minimum, weakest value). This constitutes a fine setting of the power balancing between the feed lines 101 and 102. The processor 20 then calculates a model of Rabi flopping period versus relative phase between microwave feed lines 101 and 102. This model is used to identify phase which corresponds to the minimum Rabi flopping period—where the coupling strength of the microwave field to the atomic transition takes on its maximum, largest value. This is the desired operating point of the relative phase between lines 101 and 102 for the cold atom clock 10, and the phase of microwave feed line 102 is taken at this point, which constitutes a fine setting of the relative phase between feed lines 101 and 102. In this manner, the phase and power of microwave feed lines 101 and 102 are finely balanced in a manner which optimizes the performance of the clock when in clock-mode.

This process is then repeated for another subset of microwave feed lines (e.g., microwave feed lines 103 and 104) in the plurality of microwave feed lines 101-104 during the next auxiliary-measurement cycle in blocks 402-410. For example, the process is repeated while energizing two microwave feed lines 101 and 102 of the four microwave feed lines 101-104 (FIG. 1) while the other two microwave feed lines 103 and 104 of the four microwave feed lines are not energized. Adjustments are made to the common amplitude and common phase of CD versus the AB pair as is understandable based on a reading and understanding of this document. This balances the phase and power of all of the microwave feed lines 101-104 (e.g., A-D).

When there is an odd number of microwave feed lines in the plurality of microwave feed lines, e.g., A-D, a crude adjustment or A, B, and C is done by energizing A only, then energizing B only, and then energizing C only. This constitutes a crude adjustment of the power balance of the lines. Then all three lines are energized while the phase of B is adjusted to minimize the Rabi period. Then the phase of C is adjusted to further minimize the Rabi period, then the phase of A is adjusted to further minimize Rabi time. This done iteratively until a global minimized Rabi time is achieved, which constitutes a crude adjustment of the phases of the drive lines. The fine adjustment of the power of A, B, and C is then determined as follows. The phase of A is maintained, and the phases of B and C are adjusted iteratively to sweep out a two-dimensional map of Rabi period versus their phases. There exists a peak of maximum Rabi period in this map. By executing an appropriate 2-dimensional maximization algorithm, this peak is identified. The phases of B and C are set on or nearby this peak. Then the power of B and C are adjusted. By executing another appropriate 2-dimensional maximization algorithm, the power of B and C are adjusted to make the peak as large as possible, i.e., to minimize the coupling of the microwave field to the atomic transition. This constitutes a fine setting of the power balance between the feeds A, B, and C. The final 2-D map is processed to obtain a model of the Rabi time vs phase of B relative to A, and of C relative to A. This model is used to identify the point of minimum Rabi period. The phases of B and C are set at this point. In this manner, the phase of A, B, and C are finely balanced in a manner which optimizes the performance of the clock when in clock-mode.

This calibration process prevents degradation of the performance of the cold atom clock 10 even if the cold atom clock 10 experiences large temperature swings that would cause a prior art cold atom clock to experience degraded performance.

The processor 20 functions with software programs, firmware or other computer readable instructions for carrying out various methods, process tasks, calculations, and control functions, used in the cold atom clock described herein. In one implementation, the processor 20 comprises processor support chips and/or system support chips such as application-specific integrated circuits (ASICs), or Field Programmable Gate Arrays (FPGAs).

These instructions are typically stored on any appropriate computer readable medium used for storage of computer readable instructions or data structures. The computer readable medium can be implemented as any available media that can be accessed by a general purpose or special purpose computer or processor, or any programmable logic device. Suitable processor-readable media may include storage or memory media such as magnetic or optical media. For example, storage or memory media may include conventional hard disks, Compact Disk-Read Only Memory (CD-ROM), volatile or non-volatile media such as Random Access Memory (RAM) (including, but not limited to, Synchronous Dynamic Random Access Memory (SDRAM), Double Data Rate (DDR) RAM, RAMBUS Dynamic RAM (RDRAM), Static RAM (SRAM), etc.), Read Only Memory (ROM), Electrically Erasable Programmable ROM (EEPROM), and flash memory, etc. Suitable processor-readable media may also include transmission media such as electrical, electromagnetic, or digital signals, conveyed via a communication medium such as a network and/or a wireless link.

Example Embodiments

Example 1 includes a method of operating a cold atom clock to maintain a highly homogeneous microwave field, the method comprising: driving a subset of microwave feed lines to excite a microwave field in a resonator, while a power and a phase of at least one microwave feed line in the subset is held constant, and while the power or the phase of at least one other microwave feed line in the subset is changed; measuring a strength of the atomic transition excited by the microwave field in the resonator while driving the subset of the microwave feed lines; extracting a relative power and a relative phase between or among the subset of microwave feed lines by processing the strength of the atomic transitions excited by the microwave field measured at least one auxiliary-measurement cycle; and determining if an adjustment to one or more of the microwave feed lines in the subset of microwave feed lines is needed to improve the homogeneity of the microwave field phase and amplitude based on the extracting.

Example 2 includes the method of Example 1, further comprising: obtaining N clock measurements responsive to measuring the strength of the atomic transition excited by the microwave field in the resonator while driving the subset of the microwave feed lines, wherein N is a positive integer.

Example 3 includes the method of any of Examples 1-2, further comprising: adjusting the power and/or phase of the one or more of the microwave feed lines in the subset of the microwave feed lines if an adjustment is determined to be needed.

Example 4 includes the method of any of Examples 1-3, wherein driving the subset of the microwave feed lines while the power and the phase of at least one microwave feed line in the subset is held constant, and while the power or the phase of the at least one other microwave feed line in the subset is changed comprises: driving the subset of the microwave feed lines to excite the microwave field in the resonator, while the power or the phase of the at least one other microwave feed line in the subset is at a first offset value of an auxiliary-measurement sequence; and driving the subset of the microwave feed lines to excite the microwave field in the resonator, while the power or the phase of the at least one other microwave feed line in the subset is at a second offset value of the auxiliary-measurement sequence.

Example 5 includes the method of Example 4, wherein measuring the strength of the atomic transition excited by the microwave field in the resonator while driving the subset of the microwave feed line comprises: measuring the strength of the atomic transition excited by the microwave field in the resonator while the power or the phase of the at least one other microwave feed line in the subset is at the first offset value of an auxiliary-measurement sequence to obtain a first measurement of the auxiliary-measurement sequence; and measuring the strength of the atomic transition excited by the microwave field in the resonator while the power or the phase of the at least one other microwave feed line in the subset is at the second offset value of the auxiliary-measurement sequence to obtain a second measurement of the auxiliary-measurement sequence.

Example 6 includes the method of Example 5, further comprising: obtaining N clock measurements responsive to obtaining the first measurement of the auxiliary-measurement sequence, wherein N is a positive integer; and obtaining N clock measurements responsive to obtaining the second measurement of the auxiliary-measurement sequence.

Example 7 includes the method of any of Examples 1-6, further comprising: selecting another subset of the microwave feed lines.

Example 8 includes the method of any of Examples 1-7, wherein driving the subset of the microwave feed lines, while the power and the phase of at least one microwave feed line in the subset is held constant, and while the power or the phase of at least one other microwave feed line in the subset is changed; and measuring the strength of the atomic transition excited by the microwave field in the resonator while driving the subset of the microwave feed lines comprises: driving a first subset of the microwave feed lines, while the power or the phase of the at least one other microwave feed line in the first subset is at a first offset value of an auxiliary-measurement sequence; measuring the strength of the atomic transition excited by the microwave field in the resonator while the power or the phase of the at least one other microwave feed line in the first subset is at the first offset value of the auxiliary-measurement sequence to obtain a first measurement of the auxiliary-measurement sequence for the first subset, the method further comprising: obtaining N clock measurements responsive to obtaining the first measurement of the auxiliary-measurement cycle, wherein N is a positive integer, wherein the driving the subset of the microwave feed lines, while the power and the phase of at least one microwave feed line in the subset is held constant, and while the power or the phase of at least one other microwave feed line in the subset is changed; and measuring the strength of the atomic transition excited by the microwave field in the resonator while driving the subset of the microwave feed lines further comprises: driving the first subset of the microwave feed lines, while the power or the phase of the at least one other microwave feed line in the first subset is at a second offset value of the auxiliary-measurement sequence; and measuring the strength of the atomic transition excited by the microwave field in the resonator while the power or the phase of the at least one other microwave feed line in the first subset is at the second offset value of the auxiliary-measurement cycle to obtain a second measurement of the auxiliary-measurement sequence for the first subset.

Example 9 includes the method of Example 8, further comprising: obtaining N clock measurements responsive to obtaining the second measurement of the auxiliary-measurement sequence for the first subset.

Example 10 includes the method of Example 9, further comprising: determining if all measurements for the auxiliary-measurement sequence for the first subset of the microwave feed lines have been collected, wherein extracting the relative power and the relative phase between or among the subset of microwave feed lines by processing the strength of the atomic transitions excited by the microwave field measured for the auxiliary-measurement sequence comprises: extracting the relative power and the relative phase between or among the first subset of microwave feed lines by processing the strength of the atomic transitions excited by the microwave field measured for all measurements for the auxiliary-measurement sequence for the first subset responsive to determining all the measurements for the auxiliary-measurement sequence for the first subset of the microwave feed lines have been collected.

Example 11 includes the method of Example 10, wherein determining if the adjustment to the one or more of the microwave feed lines in the subset of microwave feed lines is needed to improve the homogeneity of the microwave field phase and amplitude comprises: determining if an adjustment to the one or more of the microwave feed lines in the first subset of microwave feed lines is needed to improve the homogeneity of the microwave field phase and amplitude, the method further comprising: adjusting the one or more of the microwave feed lines in the first subset of the microwave feed lines if an adjustment is determined to be needed.

Example 12 includes a system to operate an accurate atomic clock, the system comprising: the cold atom clock comprising: a plurality of microwave feed lines; and a respective plurality of phase-and-amplitude-adjust modules associated with the plurality of microwave feed lines; a processor communicatively coupled to the cold atom clock, the processor configured to run auxiliary-measurement sequences for subsets of the plurality of microwave feed lines; and at least one algorithm executable by the processor to converge on improved operation parameters for a phase and a power of the plurality of microwave feed lines.

Example 13 includes the system of Example 12, wherein the processor configured to: drive a subset of the plurality of microwave feed lines to excite a microwave field in a resonator, while a power and a phase of at least one microwave feed line in the subset is held constant, and while the power or the phase of at least one other microwave feed line in the subset is changed; measure the strength of the atomic transition excited by the microwave field in the resonator while driving the subset of the microwave feed lines; extract a relative power and a relative phase between or among the subset of microwave feed lines by processing the strength of the atomic transitions excited by the microwave field measured for the auxiliary-measurement sequence; and determine if an adjustment to one or more of the microwave feed lines in the subset of microwave feed lines is needed to improve the homogeneity of the microwave field phase and amplitude based on the extracting.

Example 14 includes the system of Example 13, wherein the processor is further configured to: adjust the one or more of the microwave feed lines in the first subset of the microwave feed lines if the adjustment is determined to be needed.

Example 15 includes the system of any of Examples 13-14, wherein the processor is communicatively coupled to the plurality of phase-and-amplitude-adjust modules associated with the plurality of microwave feed lines, wherein if the adjustment is determined to be needed at the one or more of the microwave feed lines in the first subset of the microwave feed lines, the processor sends signals to one or more of the phase-and-amplitude-adjust modules associated with the one or more of the microwave feed lines to be adjusted, and wherein, responsive to inputting the signals, the one or more phase-and-amplitude-adjust modules adjust one of the phase and the amplitude of the one or more of the microwave feed lines.

Example 16 includes the system of any of Examples 13-15, wherein the processor is further configured to: obtain N clock measurements responsive to measuring the strength of the atomic transition excited by the microwave field in the resonator while driving the subset of the microwave feed lines, wherein N is a positive integer.

Example 17 includes the system of any of Examples 12-16, further comprising: at least one temperature sensor configured to sense a temperature of the cold atom clock; and a temperature controller communicatively coupled to input data from the at least one temperature sensor and communicatively coupled to the processor to provide information indicative of a temperature change to the processor.

Example 18 includes the system of any of Examples 12-17, wherein the processor configured to: drive a first subset of the plurality of microwave feed lines, while the power or the phase of the at least one other microwave feed line in the first subset is at a first offset value of the auxiliary-measurement sequence; measure the strength of the atomic transition excited by the microwave field in the resonator while the power or the phase of the at least one other microwave feed line in the first subset is at the first offset value of the auxiliary-measurement sequence to obtain a first measurement of the auxiliary-measurement sequence for the first subset; obtain N clock measurements responsive to obtaining the first measurement of the auxiliary-measurement sequence, wherein N is a positive integer; drive the first subset of the microwave feed lines, while the power or the phase of the at least one other microwave feed line in the first subset is at a second offset value of the auxiliary-measurement sequence; measure the strength of the atomic transition excited by the microwave field in the resonator while the power or the phase of the at least one other microwave feed line in the first subset is at the second offset value of the auxiliary-measurement sequence to obtain a second measurement of the auxiliary-measurement sequence for the first subset; obtain N clock measurements responsive to obtaining the second measurement of the auxiliary-measurement sequence for the first subset; determine if all measurements for the auxiliary-measurement sequence for the first subset of the microwave feed lines have been collected; and responsive to determining all measurements for the auxiliary-measurement sequence for the first subset of the microwave feed lines have been collected, extract the relative power and the relative phase between or among the first subset of microwave feed lines by processing the strength of the atomic transitions excited by the microwave field measured for all measurements for the auxiliary-measurement sequence for the first subset.

Example 19 includes a method of maintaining a highly homogeneous microwave field in a cold atom clock, the method comprising: driving a first subset of the microwave feed lines, while the power or the phase of the at least one other microwave feed line in the first subset is at a first offset value of the auxiliary-measurement sequence; measuring the strength of the atomic transition excited by the microwave field in the resonator while the power or the phase of the at least one other microwave feed line in the first subset is at the first offset value of the auxiliary-measurement sequence to obtain a first measurement of the auxiliary-measurement sequence for the first subset; obtaining N clock measurements responsive to obtaining the first measurement of the auxiliary-measurement cycle, wherein N is a positive integer; driving the first subset of the microwave feed lines, while the power or the phase of the at least one other microwave feed line in the first subset is at a second offset value of the auxiliary-measurement sequence; measuring the strength of the atomic transition excited by the microwave field in the resonator while the power or the phase of the at least one other microwave feed line in the first subset is at the second offset value of the auxiliary-measurement sequence to obtain a second measurement of the auxiliary-measurement sequence for the first subset; obtaining N clock measurements responsive to obtaining the second measurement of the auxiliary-measurement cycle for the first subset; determining if all measurements for the auxiliary-measurement sequence for the first subset of the microwave feed lines have been collected; responsive to determining all the measurements for the auxiliary-measurement sequence for the first subset of the microwave feed lines have been collected, the method further comprises: extracting the relative power and the relative phase between or among the first subset of microwave feed lines by processing the strength of the atomic transitions excited by the microwave field measured for all measurements for the auxiliary-measurement sequence for the first subset; and determining if an adjustment to the one or more of the microwave feed lines in the first subset of microwave feed lines is needed to improve the homogeneity of the microwave field phase and amplitude.

Example 20 includes the method of Example 19, further comprising: adjusting the one or more of the microwave feed lines in the first subset of the microwave feed lines if an adjustment is determined to be needed.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. A method of operating a cold atom clock to maintain a highly homogeneous microwave field, the method comprising:
    driving a subset of microwave feed lines to excite a microwave field in a resonator, while a power and a phase of at least one microwave feed line in the subset is held constant, and while the power or the phase of at least one other microwave feed line in the subset is changed;
    measuring a strength of the atomic transition excited by the microwave field in the resonator while driving the subset of the microwave feed lines;
    extracting a relative power and a relative phase between or among the subset of microwave feed lines by processing the strength of the atomic transitions excited by the microwave field measured in at least one auxiliary-measurement cycle; and
    determining if an adjustment to one or more of the microwave feed lines in the subset of microwave feed lines is needed to improve the homogeneity of the microwave field phase and amplitude based on the extracting.

2. The method of claim 1, further comprising:
    obtaining N clock measurements responsive to measuring the strength of the atomic transition excited by the microwave field in the resonator while driving the subset of the microwave feed lines, wherein N is a positive integer.

3. The method of claim 1, further comprising:
    adjusting the power and/or phase of the one or more of the microwave feed lines in the subset of the microwave feed lines if an adjustment is determined to be needed.

4. The method of claim 1, wherein driving the subset of the microwave feed lines while the power and the phase of at least one microwave feed line in the subset is held constant, and while the power or the phase of the at least one other microwave feed line in the subset is changed comprises:
    driving the subset of the microwave feed lines to excite the microwave field in the resonator, while the power or the phase of the at least one other microwave feed line in the subset is at a first offset value of an auxiliary-measurement sequence; and
    driving the subset of the microwave feed lines to excite the microwave field in the resonator, while the power or the phase of the at least one other microwave feed line in the subset is at a second offset value of the auxiliary-measurement sequence.

5. The method of claim 4, wherein measuring the strength of the atomic transition excited by the microwave field in the resonator while driving the subset of the microwave feed line comprises:
    measuring the strength of the atomic transition excited by the microwave field in the resonator while the power or the phase of the at least one other microwave feed line in the subset is at the first offset value of the auxiliary-measurement sequence to obtain a first measurement of the auxiliary-measurement sequence; and
    measuring the strength of the atomic transition excited by the microwave field in the resonator while the power or the phase of the at least one other microwave feed line in the subset is at the second offset value of the auxiliary-measurement sequence to obtain a second measurement of the auxiliary-measurement sequence.

6. The method of claim 5, further comprising:
    obtaining N clock measurements responsive to obtaining the first measurement of the auxiliary-measurement sequence, wherein N is a positive integer; and
    obtaining N clock measurements responsive to obtaining the second measurement of the auxiliary-measurement sequence.

7. The method of claim 1, further comprising:
    selecting another subset of the microwave feed lines.

8. The method of claim 1, wherein driving the subset of the microwave feed lines, while the power and the phase of at least one microwave feed line in the subset is held constant, and while the power or the phase of at least one other microwave feed line in the subset is changed; and measuring the strength of the atomic transition excited by the microwave field in the resonator while driving the subset of the microwave feed lines comprises;
    driving a first subset of the microwave feed lines, while the power or the phase of the at least one other microwave feed line in the first subset is at a first offset value of an auxiliary-measurement sequence;
    measuring the strength of the atomic transition excited by the microwave field in the resonator while the power or the phase of the at least one other microwave feed line in the first subset is at the first offset value of the auxiliary-measurement sequence to obtain a first measurement of the auxiliary-measurement sequence for the first subset, the method further comprising:
    obtaining N clock measurements responsive to obtaining the first measurement of the auxiliary-measurement sequence, wherein N is a positive integer,
    wherein the driving the subset of the microwave feed lines, while the power and the phase of at least one microwave feed line in the subset is held constant, and while the power or the phase of at least one other microwave feed line in the subset is changed; and measuring the strength of the atomic transition excited by the microwave field in the resonator while driving the subset of the microwave feed lines further comprises:
    driving the first subset of the microwave feed lines, while the power or the phase of the at least one other microwave feed line in the first subset is at a second offset value of the auxiliary-measurement sequence; and
    measuring the strength of the atomic transition excited by the microwave field in the resonator while the power or the phase of the at least one other microwave feed line in the first subset is at the second offset value of the auxiliary-measurement sequence to obtain a second measurement of the auxiliary-measurement sequence for the first subset.

9. The method of claim 8, further comprising:
    obtaining N clock measurements responsive to obtaining the second measurement of the auxiliary-measurement sequence for the first subset.

10. The method of claim 9, further comprising:
    determining if all measurements for the auxiliary-measurement sequence for the first subset of the microwave feed lines have been collected, wherein extracting the relative power and the relative phase between or among the subset of microwave feed lines by processing the strength of the atomic transitions excited by the microwave field measured for the auxiliary-measurement sequence comprises:

extracting the relative power and the relative phase between or among the first subset of microwave feed lines by processing the strength of the atomic transitions excited by the microwave field measured for all measurements for the auxiliary-measurement sequence for the first subset responsive to determining all the measurements for the auxiliary-measurement sequence for the first subset of the microwave feed lines have been collected.

11. The method of claim 10, wherein determining if the adjustment to the one or more of the microwave feed lines in the subset of microwave feed lines is needed to improve the homogeneity of the microwave field phase and amplitude comprises:

determining if an adjustment to the one or more of the microwave feed lines in the first subset of microwave feed lines is needed to improve the homogeneity of the microwave field phase and amplitude, the method further comprising:

adjusting the one or more of the microwave feed lines in the first subset of the microwave feed lines if an adjustment is determined to be needed.

12. A system to operate an accurate cold atom clock, the system comprising:

the cold atom clock comprising:
a plurality of microwave feed lines; and
a respective plurality of phase-and-amplitude-adjust modules associated with the plurality of microwave feed lines;
a processor communicatively coupled to the cold atom clock, the processor configured to run auxiliary-measurement sequences for subsets of the plurality of microwave feed lines; and
at least one algorithm executable by the processor to converge on improved operation parameters for a phase and a power of the plurality of microwave feed lines.

13. The system of claim 12, wherein the processor is configured to:

drive a subset of the plurality of microwave feed lines to excite a microwave field in a resonator, while a power and a phase of at least one microwave feed line in the subset is held constant, and while the power or the phase of at least one other microwave feed line in the subset is changed;
measure the strength of the atomic transition excited by the microwave field in the resonator while driving the subset of the microwave feed lines;
extract a relative power and a relative phase between or among the subset of microwave feed lines by processing the strength of the atomic transitions excited by the microwave field measured for the auxiliary-measurement sequence; and
determine if an adjustment to one or more of the microwave feed lines in the subset of microwave feed lines is needed to improve the homogeneity of the microwave field phase and amplitude based on the extracting.

14. The system of claim 13, wherein the processor is further configured to:

adjust the one or more of the microwave feed lines in the first subset of the microwave feed lines if the adjustment is determined to be needed.

15. The system of claim 13, wherein the processor is communicatively coupled to the plurality of phase-and-amplitude-adjust modules associated with the plurality of microwave feed lines, wherein if the adjustment is determined to be needed at the one or more of the microwave feed lines in the first subset of the microwave feed lines, the processor sends signals to one or more of the phase-and-amplitude-adjust modules associated with the one or more of the microwave feed lines to be adjusted, and
wherein, responsive to inputting the signals, the one or more phase-and-amplitude-adjust modules adjust one of the phase and the amplitude of the one or more of the microwave feed lines.

16. The system of claim 13, wherein the processor is further configured to:

obtain N clock measurements responsive to measuring the strength of the atomic transition excited by the microwave field in the resonator while driving the subset of the microwave feed lines, wherein N is a positive integer.

17. The system of claim 12, further comprising:

at least one temperature sensor configured to sense a temperature of the cold atom clock; and
a temperature controller communicatively coupled to input data from the at least one temperature sensor and communicatively coupled to the processor to provide information indicative of a temperature change to the processor.

18. The system of claim 12, wherein the processor is configured to:

drive a first subset of the plurality of microwave feed lines, while the power or the phase of the at least one other microwave feed line in the first subset is at a first offset value of the auxiliary-measurement sequence;
measure the strength of the atomic transition excited by the microwave field in the resonator while the power or the phase of the at least one other microwave feed line in the first subset is at the first offset value of the auxiliary-measurement sequence to obtain a first measurement of the auxiliary-measurement sequence for the first subset;
obtain N clock measurements responsive to obtaining the first measurement of an auxiliary-measurement cycle, wherein N is a positive integer;
drive the first subset of the microwave feed lines, while the power or the phase of the at least one other microwave feed line in the first subset is at a second offset value of the auxiliary-measurement sequence;
measure the strength of the atomic transition excited by the microwave field in the resonator while the power or the phase of the at least one other microwave feed line in the first subset is at the second offset value of the auxiliary-measurement sequence to obtain a second measurement of the auxiliary-measurement sequence for the first subset;
obtain N clock measurements responsive to obtaining the second measurement of the auxiliary-measurement sequence for the first subset;
determine if all measurements for the auxiliary-measurement cycle for the first subset of the microwave feed lines have been collected; and
responsive to determining all measurements for the auxiliary-measurement sequence for the first subset of the microwave feed lines have been collected, extract the relative power and the relative phase between or among the first subset of microwave feed lines by processing the strength of the atomic transitions excited by the microwave field measured for all measurements for the auxiliary-measurement sequence for the first subset.

19. A method of maintaining a highly homogeneous microwave field in a cold atom clock, the method comprising:
- driving a first subset of the microwave feed lines, while the power or the phase of the at least one other microwave feed line in the first subset is at a first offset value of an auxiliary-measurement sequence;
- measuring the strength of the atomic transition excited by the microwave field in the resonator while the power or the phase of the at least one other microwave feed line in the first subset is at the first offset value of the auxiliary-measurement sequence to obtain a first measurement of the auxiliary-measurement sequence for the first subset;
- obtaining N clock measurements responsive to obtaining the first measurement of an auxiliary-measurement cycle, wherein N is a positive integer;
- driving the first subset of the microwave feed lines, while the power or the phase of the at least one other microwave feed line in the first subset is at a second offset value of the auxiliary-measurement sequence;
- measuring the strength of the atomic transition excited by the microwave field in the resonator while the power or the phase of the at least one other microwave feed line in the first subset is at the second offset value of the auxiliary-measurement cycle to obtain a second measurement of the auxiliary-measurement cycle for the first subset;
- obtaining N clock measurements responsive to obtaining the second measurement of the auxiliary-measurement cycle for the first subset;
- determining if all measurements for the auxiliary-measurement sequence for the first subset of the microwave feed lines have been collected;
- responsive to determining all the measurements for the auxiliary-measurement sequence for the first subset of the microwave feed lines have been collected, the method further comprises:
- extracting the relative power and the relative phase between or among the first subset of microwave feed lines by processing the strength of the atomic transitions excited by the microwave field measured for all measurements for the auxiliary-measurement sequence for the first subset; and
- determining if an adjustment to the one or more of the microwave feed lines in the first subset of microwave feed lines is needed to improve the homogeneity of the microwave field phase and amplitude.

20. The method of claim 19, further comprising:
- adjusting the one or more of the microwave feed lines in the first subset of the microwave feed lines if an adjustment is determined to be needed.

* * * * *